(12) United States Patent
Kramer et al.

(10) Patent No.: US 9,685,342 B2
(45) Date of Patent: Jun. 20, 2017

(54) WAFER PROCESSING APPARATUSES AND METHODS OF OPERATING THE SAME

(71) Applicant: GLOBALFOUNDRIES, Inc., Grand Cayman (KY)

(72) Inventors: Jens Kramer, Dresden (DE); Uwe Schoene, Kamenz (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 191 days.

(21) Appl. No.: 14/567,598

(22) Filed: Dec. 11, 2014

(65) Prior Publication Data

US 2016/0172255 A1    Jun. 16, 2016

(51) Int. Cl.
| | |
|---|---|
| H01L 21/66 | (2006.01) |
| H01L 21/306 | (2006.01) |
| B24B 53/017 | (2012.01) |
| B24B 37/005 | (2012.01) |
| B24B 49/12 | (2006.01) |

(52) U.S. Cl.
CPC ...... *H01L 21/30625* (2013.01); *B24B 37/005* (2013.01); *B24B 49/12* (2013.01); *B24B 53/017* (2013.01)

(58) Field of Classification Search
CPC ..... B24B 37/005; B24B 49/12; B24B 53/017; H01L 21/30625; H01L 22/24
See application file for complete search history.

(56) References Cited

U.S. PATENT DOCUMENTS

| | | | | |
|---|---|---|---|---|
| 5,708,506 A | * | 1/1998 | Birang | .................... B24B 49/12 356/600 |
| 7,150,675 B2 | | 12/2006 | Kramer et al. | |
| 2014/0262027 A1 | * | 9/2014 | Matsuo | ................ G01B 11/303 156/345.13 |
| 2015/0056891 A1 | * | 2/2015 | Matsuo | .................... B24B 49/12 451/6 |
| 2015/0170978 A1 | * | 6/2015 | Chen | ....................... H01L 22/12 438/8 |

\* cited by examiner

*Primary Examiner* — Joseph J Hail
*Assistant Examiner* — Marc Carlson
(74) *Attorney, Agent, or Firm* — Lorenz & Kopf, LLP

(57) ABSTRACT

Wafer processing apparatuses and methods of operating the same are provided herein. In an embodiment, a wafer processing apparatus includes a rotatable platen that has the capacity to support a polishing pad on a pad mounting surface of the rotatable platen. A drive assembly is coupled to the rotatable platen and has the capacity to rotate the rotatable platen. A polishing head is coupled to a head actuator. The polishing head is disposed adjacent to and over a first portion of the pad mounting surface and the polishing head is movable relative to the pad mounting surface by the head actuator. An optical sensor has a vision field including a second portion of the pad mounting surface. The first portion and the second portion of the pad mounting surface are at least partially offset. A control unit is operatively connected to the drive assembly and the head actuator.

17 Claims, 2 Drawing Sheets

WAFER PROCESSING APPARATUSES AND METHODS OF OPERATING THE SAME

TECHNICAL FIELD

The technical field generally relates to wafer processing apparatuses and methods of operating the same, and more particularly relates to wafer processing apparatuses and methods that provide for defect detection in a polishing pad used therein.

BACKGROUND

In microstructures such as integrated circuits, a large number of elements, such as transistors, capacitors and resistors, are fabricated on a single semiconductor wafer by depositing semiconductive, conductive and insulating material layers and patterning these layers by photolithography and etch techniques. Frequently, the problem arises that the patterning of a subsequent material layer is adversely affected by a pronounced topography of the previously formed material layers. Moreover, the fabrication of microstructures often requires the removal of excess material of a previously deposited material layer. The repeated patterning of material layers, however, creates an increasingly non-planar surface topography, which may deteriorate subsequent patterning processes, especially for microstructures that include features with minimum dimensions in the submicron range, as is the case for sophisticated integrated circuits. Planar surface topography is desirable for various reasons. For example, photolithography has a limited optical depth of focus and non-planar surface topography may impact precision of pattern formation through photolithography. Additionally, electrical insulation between adjacent structures may be compromised if planar topography is not maintained.

Chemical mechanical planarization (CMP) is a common technique employed during fabrication of the integrated circuits to remove excess materials and to achieve planar layers for subsequent material deposition. CMP generally involves polishing an exposed surface of a wafer or layer formed thereon using a polishing pad that is disposed on a rotatable platen. As industry moves to manufacture nodes on an ever-decreasing size scale, CMP specifications continue to tighten and defects in a polishing surface of the polishing pad may contribute to inconsistent planarization between different wafers and/or in different regions within individual wafers. Defects in the polishing surface may arise during manufacture of the polishing pad and/or during CMP, and examples of defects include bubbles or uneven wear of the polishing surface.

Existing quality control techniques include pretreatment of the polishing pads by a third party supplier, which generally involves shipping the polishing pads to the third party supplier for pre-shaping and/or pre-surfacing. The polishing pads are then shipped to a fabrication facility and mounted on the rotatable platen. However, such pre-treatment is costly, time consuming, inconvenient, and does not address quality issues that arise after usage of the polishing pads commences. To address quality issues during usage of the polishing pads, processed wafers must be examined after CMP to measure the surface topography. However, such techniques often result in significant delay in identifying CMP problems, are time consuming, and result in significant product waste.

Accordingly, it is desirable to provide wafer processing apparatuses that are employed to perform CMP and methods of operating the wafer processing apparatuses that enable earlier identification of CMP problems as compared to examination of processed wafers. Additionally, it is desirable to provide wafer processing apparatuses and methods of operating the wafer processing apparatuses that enable product waste to be minimized. Furthermore, other desirable features and characteristics will become apparent from the subsequent detailed description and the appended claims, taken in conjunction with the accompanying drawings and this background.

BRIEF SUMMARY

Wafer processing apparatuses and methods of operating the wafer processing apparatuses are provided herein. In an embodiment, a wafer processing apparatus includes a rotatable platen that has the capacity to support a polishing pad on a pad mounting surface of the rotatable platen. A drive assembly is coupled to the rotatable platen and has the capacity to rotate the rotatable platen. A polishing head is coupled to a head actuator. The polishing head is disposed adjacent to and over a first portion of the pad mounting surface and the polishing head is movable relative to the pad mounting surface by the head actuator. An optical sensor has a vision field including a second portion of the pad mounting surface. The first portion and the second portion of the pad mounting surface are at least partially offset. A control unit is operatively connected to the drive assembly and the head actuator.

In another embodiment, a wafer processing apparatus includes a rotatable platen that has the capacity to support a polishing pad on a pad mounting surface of the rotatable platen. A drive assembly is coupled to the rotatable platen and has the capacity to rotate the rotatable platen. A polishing head is coupled to a head actuator. The polishing head is disposed adjacent to and over a first portion of the pad mounting surface and the polishing head is movable relative to the pad mounting surface by the head actuator. An optical sensor has a vision field including a second portion of the pad mounting surface. The first portion and the second portion of the pad mounting surface are non-overlapping. An illumination source is configured to illuminate the second portion of the pad mounting surface with a light pattern that includes lines separated by a predetermined spacing. A pad conditioning arm is coupled to a conditioner actuator. The pad conditioning arm is disposed adjacent to and over a third portion of the pad mounting surface. The third portion is non-overlapping with the first portion and the second portion. A control unit is operatively connected to the drive assembly, the head actuator, the optical sensor, and the conditioner actuator.

In another embodiment, a method of operating a wafer processing apparatus is provided. The wafer processing apparatus includes a rotatable platen, an optical sensor, and a control unit. The method includes installing a polishing pad on a pad mounting surface of the rotatable platen, wherein the polishing pad includes a polishing surface. The polishing surface is interrogated with the optical sensor to produce optical image data of the polishing surface after installing the polishing pad on the pad mounting surface. The optical image data is analyzed using the control unit.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the wafer processing apparatuses and methods of operating the same as described herein. Furthermore, there is no intention to be bound by any theory presented in the preceding background or the following detailed description.

Embodiments of the present disclosure involve fabrication of integrated circuits and, in particular, chemical mechanical planarization (CMP) techniques that are employed during integrated circuit fabrication. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein.

Wafer processing apparatuses and methods of operating the wafer processing apparatuses are provided herein. The wafer processing apparatuses are employed to perform CMP and include conventional features such as a rotatable platen that has the capacity to support a polishing pad on a pad mounting surface thereof, a drive assembly for the rotatable platen, a polishing head disposed adjacent to and over a first portion of the pad mounting surface, a head actuator coupled to the polishing head, and a control unit that is operatively connected to the drive assembly and the head actuator. Additionally, the wafer processing apparatuses include an optical sensor that has a vision field that includes a second portion of the pad mounting surface, and the first portion and the second portion of the pad mounting surface are at least partially offset. As referred to herein, "vision field" refers to any space that is viewed by the optical sensor in the wafer processing apparatus. As also referred to herein, "offset" means that the first portion and the second portion may overlap but are not completely overlaid. During operation of the wafer processing apparatus, a polishing pad is installed on the pad mounting surface. The offset relationship between the first portion and the second portion of the pad mounting surface, and corresponding portions of the polishing surface of the polishing pad when installed on the pad mounting surface, enables the optical sensor to view the polishing surface either before initial usage of the polishing pad for CMP or during CMP. Based upon optical image data produced by the optical sensor, earlier identification of CMP problems that are attributable to defects in the polishing pad is possible as compared to examination of processed wafers. Additionally, by identification of defects in the polishing pad itself, product waste can be minimized, thereby maximizing processing efficiency.

Figure 1:
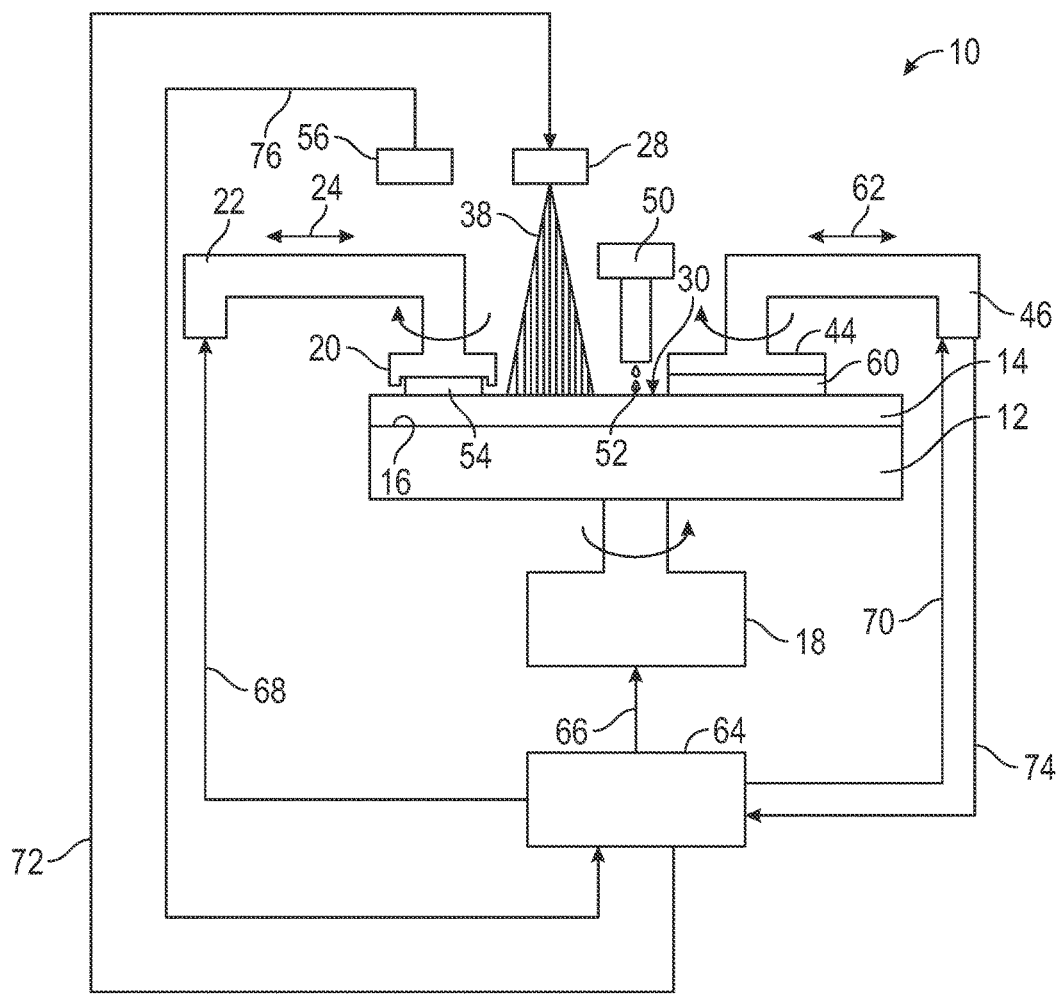
FIG. 1 is a schematic side view of a wafer processing apparatus and a method of operating the same in accordance with an embodiment.
Figure 2:
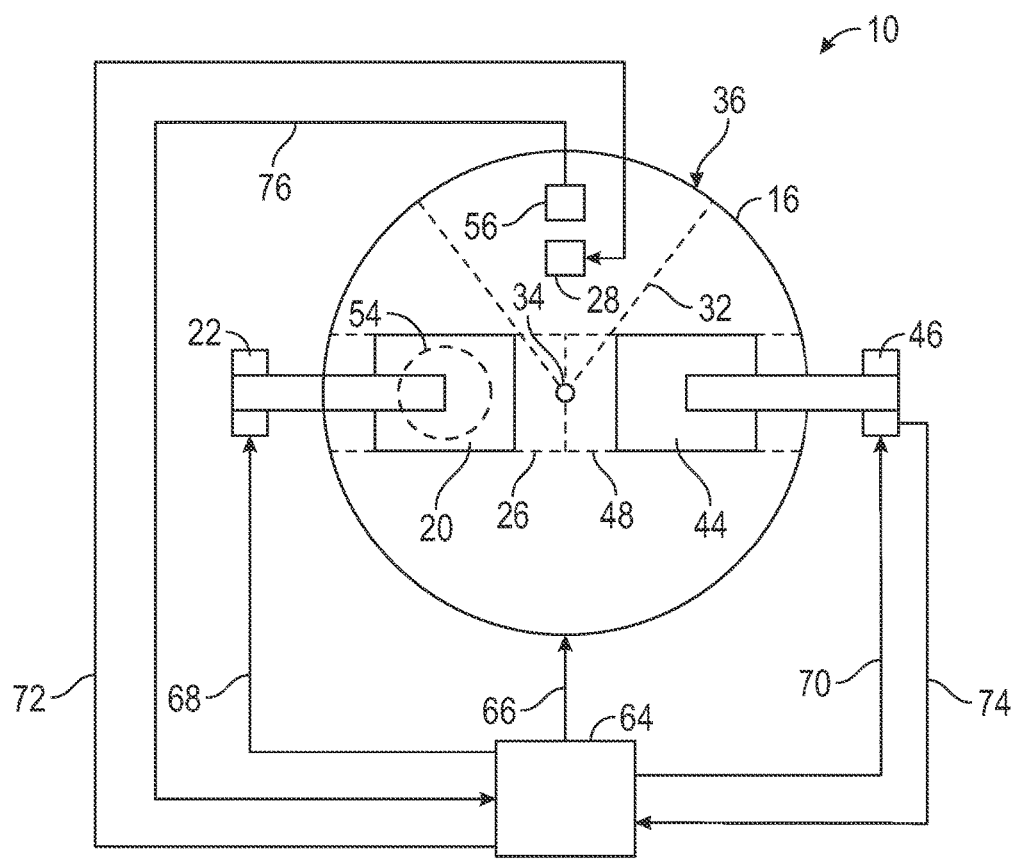
FIG. 2 is a schematic top view of the wafer processing apparatus and method of operating the same in accordance with the embodiment of FIG. 1.
Figure 3:
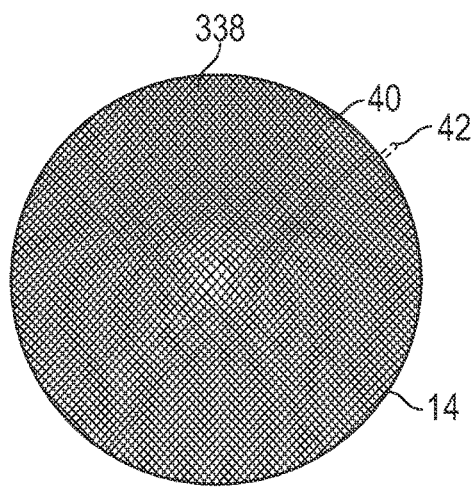
FIG. 3 is a schematic top view of a polishing pad with a light pattern projected onto a surface thereof in accordance with an embodiment.
Figure 4:
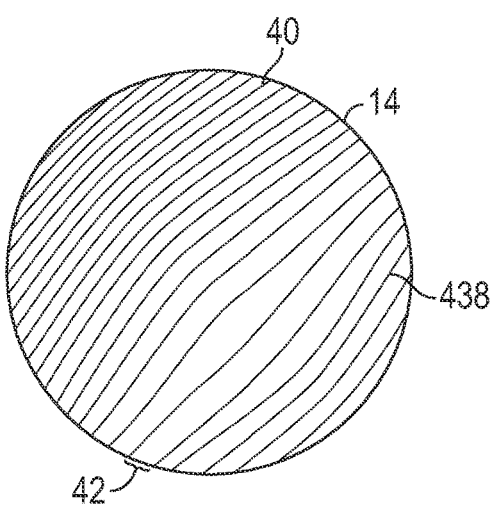
FIG. 4 is a schematic top view of a polishing pad with a light pattern projected onto a surface thereof in accordance with another embodiment.

An embodiment of a wafer processing apparatus 10 will now be described with reference to FIGS. 1-4. Referring to FIG. 1, the wafer processing apparatus 10 includes a rotatable platen 12 that has the capacity to support a polishing pad 14 on a pad mounting surface 16 of the rotatable platen 12. As referred to herein, the "pad mounting surface" refers to the surface of the rotatable platen 12 that is configured to receive the polishing pad 14 and excludes surfaces of the rotatable platen 12 that are not covered by the polishing pad 14 when the polishing pad 14 is installed on the rotatable platen 12. While FIG. 1 illustrates the polishing pad 14 disposed on the pad mounting surface 16, it is to be appreciated that the polishing pad 14 is an interchangeable element that is installed on the wafer processing apparatus 10 during operation but is not part of the wafer processing apparatus 10 itself. FIG. 2 illustrates the pad mounting surface 16 without the polishing pad disposed thereon. A drive assembly 18 is coupled to the rotatable platen 12 and has the capacity to rotate the rotatable platen 12 at any desired revolution rate between a range of zero to several hundred revolutions per minute (RPM). A polishing head 20 is coupled to a head actuator 22, and the polishing head 20 is movable relative to the pad mounting surface 16 by the head actuator 22, and the head actuator 22 is adapted to rotate the polishing head 20 and to move the polishing head 20 radially with respect to the rotatable platen 12 as indicated by arrows 24. Referring to FIG. 2, the polishing head 20 is disposed adjacent to and over a first portion 26 of the pad mounting surface 16, and a wafer 54 may be secured to the polishing head 20 for conducting CMP of the wafer 54 during operation of the wafer processing apparatus 10. "Disposed adjacent to and over", as referred to herein, means that the element referred to covers a corresponding surface of the polishing pad 14 that is disposed on the pad mounting surface 16 when the polishing pad 14 is installed. For example, the polishing head 20 covers a corresponding surface of the polishing pad 14 that is disposed on the first portion 26 of the pad mounting surface 16 when the polishing pad 14 is installed. It is to be appreciated that "portions" of the pad mounting surface 16, as referred to herein, are not static but rather represent areas where various elements are disposed over the pad mounting surface 16. The pad mounting surface 16 rotates during operation, but the exact location of the "portions" of the pad mounting surface 16 as referred to herein change as the pad mounting surface 16 rotates. In embodiments and referring to FIG. 1, the wafer processing apparatus 10 further includes a pad conditioning arm 44 that is coupled to a conditioner actuator 46. The conditioner actuator 46 is adapted to rotate the pad conditioning arm 44 and to move the pad conditioning arm 44 radially with respect to the rotatable platen 12 as indicated by arrows 62. Like the polishing head 20 and referring to FIG. 2, the pad conditioning arm 44 is disposed adjacent to and over a third portion 48 of the pad mounting surface 16. Referring to FIG. 1, a conditioning member 60 is mounted to the pad conditioning arm 44. The conditioning member 60 has a conditioning surface that includes an appropriate material, such as diamond, that has a specified texture designed to obtain an optimum conditioning effect on the polishing surface 30 of the polishing pad 14. A slurry supply 50 may be disposed over the pad mounting surface 16 for delivery a polishing slurry 52 to the polishing surface 30 of the polishing pad 14 during operation of the wafer processing apparatus 10.

In embodiments and referring to FIG. 1, the wafer processing apparatus 10 further includes an illumination source 28. The illumination source 28 may be any device that has the capacity to produce light 38 and that directs the light 38 to a polishing surface 30 of the polishing pad 14 when the polishing pad 14 is installed on the pad mounting surface 16.

For example, suitable illumination sources 28 may include a laser generator, a light emitting diode, a lamp, or the like. In embodiments, the light 38 produced by the illumination source 28 is employed to detect defects in the polishing surface 30 of the polishing pad 14 using an optical sensor 56, as described in further detail below. In embodiments, the illumination source 28 is configured to produce the light 38 in a light pattern. The light 38 may be produced in any light pattern that will reveal surface contours or defects on the polishing surface 30 of the polishing pad 14. In embodiments and referring to FIGS. 3 and 4, light 338, 438 is produced in light patterns that include lines 40 separated by a predetermined spacing 42. The predetermined spacing 42 is less than a minimum defect size that is sought for detection by the optical sensor 56. In embodiments, the predetermined spacing 42 is from about 0.05 to about 1 cm. For example, if detection of bubbles is desired, the predetermined spacing 42 is less than or equal to 1 cm, such as from about 0.2 to about 1 cm. If detection of defects such as uneven wear is desired, the predetermined spacing 42 may be less than or equal to about 0.1 cm, such as from about 0.05 to about 0.1 cm. Additionally, width of the lines 40 in the light pattern is less than the minimum defect size sought for detection by the optical sensor 56 to avoid completely covering the defects with the lines 40. Examples of suitable light patterns include a grid pattern (see FIG. 3), a series of parallel lines (see FIG. 4), a series of circles (not shown), or any other pattern that will reveal surface contours or defects on the polishing surface 30.

In embodiments and as shown in FIGS. 1 and 2, the illumination source 28 is disposed adjacent to the pad mounting surface 16. Referring to FIG. 2, the illumination source 28 is configured to illuminate a second portion 32 of the pad mounting surface 16, although it is to be appreciated that during operation the illumination source 28 illuminates a corresponding portion of the polishing pad 14 that is disposed over the second portion 32 of the pad mounting surface 16. It is also to be appreciated that the illumination source 28 may illuminate portions other than the second portion 32, and that in embodiments the illumination source 28 illuminates only some of the second portion 32 while in other embodiments the illumination source 28 illuminates the entire second portion 32. The second portion 32 of the pad mounting surface 16, as referred to herein, is a portion that is to be included in a vision field of the optical sensor 56, as described in further detail below. In embodiments and as shown in FIG. 2, the second portion 32 of the pad mounting surface 16 includes a rotational radius of the pad mounting surface 16. As referred to herein, the "rotational radius" is the distance from an axis of rotation 34 of the rotatable platen 12 to a radial edge 36 of the pad mounting surface 16. The second portion 32 may be pie-shaped and is generally not covered by other elements such as the polishing head 20 during operation of the wafer processing apparatus 10, which may enable the entire polishing surface 30 of the polishing pad 14 to be viewed by the optical sensor 56 during rotation of the rotatable platen 12. In particular, the first portion 26 of the pad mounting surface 16 and the second portion 32 of the pad mounting surface 16 are at least partially offset so that the illumination source 28 can properly illuminate the polishing surface 30 of the polishing pad 14 during operation. Additionally, the third portion 48 is at least partially offset with the first portion 26 and the second portion 32. In embodiments and as shown in FIG. 2, the first portion 26 and the second portion 32 of the pad mounting surface 16 may be overlapping, but are not completely overlaid to enable illumination of the polishing surface 30 of the polishing pad 14 during operation. Additionally, the third portion 48 of the pad mounting surface 16 that is adjacent to the pad conditioning arm 44 and the second portion 32 of the pad mounting surface 16 may also be overlapping, but are also not completely overlaid to enable illumination of the polishing surface 30 of the polishing pad 14 during operation. In other embodiments and although not shown, the first portion 26, the second portion 32, and the third portion 48 are non-overlapping.

As alluded to above, the wafer processing apparatus 10 further includes the optical sensor 56. The optical sensor 56 is positioned to have a vision field that includes the second portion 32 of the pad mounting surface 16, and the optical sensor 56 may be disposed adjacent to and over the pad mounting surface 16. In embodiments, the vision field covers an entire radius of the polishing surface 30 during at least one state of operation of the wafer processing apparatus 10, e.g., the pad conditioning arm 44 and the polishing head 20 are movable outside of second portion 32 so that the entire radius of the polishing surface 30 can be viewed to thereby enable entire surface interrogation during rotation of the polishing pad 14. The optical sensor 56 has a sufficient resolution to distinguish between lines 40 in the light pattern produced by the illumination source 28 to enable variations in the lines 40 that are caused by contours or defects in the polishing surface 30 of the polishing pad 14 to be detected, as described in further detail below. In embodiments, the optical sensor 56 is configured to produce optical image data 76 with an optical resolution of about 1024×768 pixels or greater (e.g., XGA resolution and higher). In other embodiments, 640×480 pixels or greater (e.g., VGA resolution and higher) may be possible. An example of a suitable optical sensor 56 is a charge coupled device (CCD) sensor.

Referring to FIGS. 1 and 2, a control unit 64 is operatively connected to the drive assembly 18 and the head actuator 22. The control unit 64 may also be operatively connected to the slurry supply 50 to initiate dispensation of polishing slurry 52. Additionally, the control unit 64 may also be operatively connected to the optical sensor 56, the conditioner actuator 46, the illumination source 28, or any combination of the aforementioned devices to enable adjustment of the drive assembly 18, the head actuator 22, and/or the conditioner actuator 46 as desired. In embodiments, the control unit 64 is employed to remediate the defects in the polishing pad 14 based upon the image date produced by the optical sensor 56 as described in further detail below. Alternatively, in other embodiments and although not shown, the optical sensor 56 can be operatively connected to a separate control unit to analyze and register defects in the polishing pad 14.

The control unit 64 may be adapted to communicate with appropriate communications networks, such as through cable connections, wireless networks and the like. For instance, the control unit 64 may include a sub-control unit (not shown) as is provided in conventional CMP systems so as to appropriately provide control signals 66, 68, 70 to the drive assembly 18, the head actuator 22, and the conditioner actuator 46, respectively, so as to coordinate the movement of the polishing head 20, the polishing pad 14 and the pad conditioning arm 44, respectively. The control signals 66, 68, 70 may represent any suitable signal form to instruct the corresponding devices to operate at the desired rotational and/or translatory speeds. Additionally, an illumination signal 72 may be provided by the control unit 64 to the illumination source 28 to control the light 38 produced thereby. In embodiments, the control unit 64 is further adapted to receive a feedback signal 74 from the conditioner actuator 46, and may also be adapted to receive optical image data 76 from the optical sensor 56.

Embodiments of a method of operating the wafer processing apparatus 10 will now be described with reference to FIGS. 1-4. In embodiments of the exemplary method, the polishing pad 14 is installed on the pad mounting surface 16 of the rotatable platen 12. A wafer 54 or a layer disposed on the wafer 54 is polished using the polishing pad 14 by rotating the rotatable platen 12. The polishing surface 30 of the polishing pad 14 is interrogated with the optical sensor 56 to produce optical image data 76 of the polishing surface 30 after installing the polishing pad 14 on the pad mounting surface 16. For example, the polishing surface 30 may be interrogated by directing light 38 in the light pattern from the illumination source 28 onto the polishing surface 30 and detecting the light pattern with the optical sensor 56 to produce the optical image data 76 of the light pattern on the polishing surface 30. In other embodiments, it may be possible to interrogate the polishing surface 30 with the optical sensor 56 but without use of the illumination source 28.

In accordance with embodiments, the optical image data 76 produced by the optical sensor 56 is analyzed using the control unit 64. Based upon analysis of the optical image data 76, defects in the polishing surface 30 of the polishing pad 14 may be identified by the control unit 64. For example, in embodiments, a defect such as a bubble or uneven wear is present in the polishing surface 30, and the optical image data 76 is analyzed by comparing the light pattern in the optical image data 76 to a standard pattern to identify the defect. In embodiments, the optical image data 76 is analyzed in real time. The control unit 64 may be programmed with software that measures deviation of lines 40 in the light pattern of the optical image data 76 as compared to the standard pattern. If the deviation exceeds a predetermined threshold, the control unit 64 may provide an indication that a defect has been identified. For example, a trigger or alarm may be initiated, or the control unit 64 may initiate remediation of the defect. In embodiments, the wafer processing apparatus 10 may be disabled until the defect in the polishing pad 14 is remediated.

In embodiments, the defect in the polishing surface 30 is remediated based upon identification of the defect by the control unit 64. For example, the defect may be remediated while rotating the polishing pad 14 without removing the polishing pad 14 from the pad mounting surface 16 by using the pad conditioning arm 44 to remediate the defects in the polishing surface 30. In particular, the pad conditioning arm 44 may be adjusted to condition an area of the polishing surface 30 based upon identification of the defect. In embodiments, the polishing surface 30 has a defect before initial usage of the polishing pad 14 for CMP. For example, the defect may have arisen during manufacture of the polishing pad 14. In this embodiment, the defect in the polishing surface 30 may be remediated prior to initial usage of the polishing pad 14 to polish any wafer 54, with interrogation conducted prior to conducting CMP by rotating the polishing pad 14 using the rotatable platen 12 and interrogating the polishing surface 30 using the optical sensor 56. In other embodiments, the defect may arise during usage of the polishing pad 14, and the defect in the polishing surface 30 may be remediated during usage of the polishing pad 14 to polish the wafer 54 or between CMP operations conducted on the same or different wafers.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. A wafer processing apparatus comprising:
a rotatable platen having the capacity to support a polishing pad on a pad mounting surface of the rotatable platen;
a drive assembly coupled to the rotatable platen and having the capacity to rotate the rotatable platen;
a polishing head coupled to a head actuator, wherein the polishing head is disposed adjacent to and over a first portion of the pad mounting surface and wherein the polishing head is movable relative to the pad mounting surface by the head actuator;
an optical sensor having a vision field including a second portion of the pad mounting surface, wherein the first portion and the second portion of the pad mounting surface are at least partially offset;
an illumination source disposed adjacent to the pad mounting surface, wherein the illumination source is configured to illuminate the second portion of the pad mounting surface with a light pattern comprising a plurality of simultaneous lines separated by a predetermined spacing; and
a control unit operatively connected to the drive assembly and the head actuator.

2. The wafer processing apparatus of claim 1, wherein the optical sensor has a sufficient resolution to distinguish between the lines in the light pattern produced by the illumination source.

3. The wafer processing apparatus of claim 1, wherein the optical sensor is further operatively connected to the control unit.

4. The wafer processing apparatus of claim 3, wherein the optical sensor produces optical image data of the light pattern on the polishing surface and wherein the control unit is programmed with software that measures deviation of lines in the light pattern of the optical image data as compared to a standard pattern.

5. The wafer processing apparatus of claim 1, further comprising a pad conditioning arm coupled to a conditioner actuator, wherein the pad conditioning arm is disposed adjacent to and over a third portion of the pad mounting surface, wherein the third portion is at least partially offset with the first portion and the second portion.

6. The wafer processing apparatus of claim 5, wherein the conditioner actuator is further operatively connected to the control unit.

7. The wafer processing apparatus of claim 1, wherein the second portion of the pad mounting surface includes a rotational radius of the pad mounting surface.

8. A wafer processing apparatus comprising:
a rotatable platen having the capacity to support a polishing pad on a pad mounting surface of the rotatable platen;
a drive assembly coupled to the rotatable platen and having the capacity to rotate the rotatable platen;
a polishing head coupled to a head actuator, wherein the polishing head is disposed adjacent to and over a first portion of the pad mounting surface and wherein the polishing head is movable relative to the pad mounting surface by the head actuator;

an optical sensor having a vision field including a second portion of the pad mounting surface, wherein the first portion and the second portion of the pad mounting surface are nonoverlapping;

an illumination source configured to illuminate the second portion of the pad mounting surface with a light pattern comprising a plurality of simultaneous lines separated by a predetermined spacing;

a pad conditioning arm coupled to a conditioner actuator, wherein the pad conditioning arm is disposed adjacent to and over a third portion of the pad mounting surface, wherein the third portion is non-overlapping with the first portion and the second portion;

a control unit operatively connected to the drive assembly, the head actuator, the optical sensor, and the conditioner actuator.

9. A method of operating a wafer processing apparatus comprising a rotatable platen, an optical sensor, and a control unit, wherein the method comprises:

installing a polishing pad on a pad mounting surface of the rotatable platen, wherein the polishing pad includes a polishing surface;

interrogating the polishing surface with the optical sensor to produce optical image data of the polishing surface after installing the polishing pad on the pad mounting surface wherein interrogating the polishing surface further comprises directing a light pattern from an illumination source and comprising a plurality of simultaneous lines separated by a predetermined spacing onto the polishing surface:

analyzing the optical image data using the control unit.

10. The method of claim 9, wherein interrogating the polishing surface with the optical sensor comprises detecting the light pattern with the optical sensor to produce the optical image data of the light pattern on the polishing surface.

11. The method of claim 10, wherein a defect is present in the polishing surface, and wherein analyzing the optical image data comprises comparing the light pattern in the optical image data to a standard pattern and identifying the defect based upon the comparison.

12. The method of claim 11, wherein analyzing the optical image data comprises analyzing the optical image data in real time to identify the defect in the polishing surface.

13. The method of claim 11, further comprising remediating the defect in the polishing surface based upon identification of the defect in the polishing surface by the control unit while rotating the polishing pad using the rotatable platen.

14. The method of claim 11, wherein the wafer processing apparatus further comprises a pad conditioning arm disposed adjacent to and over the polishing surface, and wherein the method further comprises remediating the defect in the polishing surface using the pad conditioning arm based upon identification of the defect in the polishing surface by the control unit.

15. The method of claim 14, further comprising polishing a wafer or a layer disposed thereon using the polishing pad.

16. The method of claim 15, wherein remediating the defect in the polishing surface comprises remediating the defect in the polishing surface prior to initial usage of the polishing pad to polish any wafer.

17. The method of claim 15, wherein remediating the defect in the polishing surface comprises remediating the defect in the polishing surface during usage of the polishing pad to polish the wafer.

* * * * *